United States Patent
Chen et al.

(10) Patent No.: US 10,163,952 B2
(45) Date of Patent: Dec. 25, 2018

(54) BACKSIDE ILLUMINATED IMAGE SENSOR DEVICE STRUCTURE

(71) Applicant: Taiwan Semiconductor Manufacturing Co., Ltd., Hsinchu (TW)

(72) Inventors: Chia-Chan Chen, Zhubei (TW); Yueh-Chuan Lee, Hsinchu (TW); Chih-Huang Li, Taichung (TW); Ta-Hsin Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/402,836

(22) Filed: Jan. 10, 2017

(65) Prior Publication Data

US 2018/0166475 A1    Jun. 14, 2018

Related U.S. Application Data

(60) Provisional application No. 62/434,130, filed on Dec. 14, 2016.

(51) Int. Cl.
*H01L 27/146* (2006.01)

(52) U.S. Cl.
CPC ...... *H01L 27/1463* (2013.01); *H01L 27/1464* (2013.01); *H01L 27/14621* (2013.01); *H01L 27/14632* (2013.01); *H01L 27/14636* (2013.01); *H01L 27/14645* (2013.01); *H01L 27/14685* (2013.01); *H01L 27/14687* (2013.01); *H01L 27/14689* (2013.01)

(58) Field of Classification Search
CPC .......... H01L 27/1463; H01L 27/14621; H01L 27/14689; H01L 27/1464; H01L 27/14632; H01L 27/14685; H01L 27/14645; H01L 27/14636; H01L 27/14687
See application file for complete search history.

(56) References Cited

U.S. PATENT DOCUMENTS

| | | | |
|---|---|---|---|
| 2013/0113061 A1* | 5/2013 | Lai | H01L 27/1463 257/432 |
| 2013/0285180 A1* | 10/2013 | Wang | H01L 27/14618 257/432 |
| 2014/0035083 A1* | 2/2014 | Wan | H01L 27/14634 257/432 |
| 2017/0125462 A1* | 5/2017 | Yu | H01L 27/1463 |

* cited by examiner

*Primary Examiner* — Steven Loke
*Assistant Examiner* — Juanita Rhodes
(74) *Attorney, Agent, or Firm* — Birch, Stewart, Kolasch & Birch, LLP

(57) ABSTRACT

A method for forming a backside illuminated (BSI) image sensor device structure is provided. The BSI image sensor includes a first substrate having a top surface and a bottom surface, and a plurality of pixel regions formed at the top surface of the first substrate. The BSI image sensor also includes a grid structure through the first substrate and between two adjacent pixel regions. The grid structure extends continuously through the first substrate in a vertical direction and has a top surface and a bottom surface, the top surface of the grid structure protrudes above the bottom surface of the first substrate, and the bottom surface is leveled with the top surface of the first substrate.

20 Claims, 11 Drawing Sheets

BACKSIDE ILLUMINATED IMAGE SENSOR DEVICE STRUCTURE

CROSS REFERENCE TO RELATED APPLICATIONS

This Application claims the benefit of U.S. Provisional Application No. 62/434,130, filed on Dec. 14, 2016, and entitled "Backside illuminated image sensor device structure", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

An image sensor is used to convert an optical image focused on the image sensor into an electrical signal. The image sensor includes an array of light-detecting elements, such as photodiodes, and a light-detecting element is configured to produce an electrical signal corresponding to the intensity of light impinging on the light-detecting element. The electrical signal is used to display a corresponding image on a monitor or provide information about the optical image.

Although existing image sensor device structures and methods for forming the same have been generally adequate for their intended purpose they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1K show cross-sectional representations of various stages of forming a backside illuminated image sensor device structure, in accordance with some embodiments of the disclosure.

FIG. 2 shows a cross-sectional representation of a backside illuminated image sensor device structure, in accordance with some embodiments of the disclosure.

FIGS. 3A-3H show cross-sectional representations of various stages of forming a backside illuminated image sensor device structure, in accordance with some embodiments of the disclosure.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a backside illuminated (BSI) image sensor device structure and method for forming the same are provided. FIGS. 1A-1K show cross-sectional representations of various stages of forming a backside illuminated image sensor device structure 100*a*, in accordance with some embodiments of the disclosure.

Referring to FIG. 1A, a first substrate 102 is provided. The first substrate 102 has a top surface 102*a* and a bottom surface 102*b* opposite to the top surface 102*a*. The first substrate 102 may be made of silicon or other semiconductor materials. In some embodiments, the first substrate 102 is a wafer. Alternatively or additionally, the first substrate 102 may include other elementary semiconductor materials such as germanium. In some embodiments, the first substrate 102 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the first substrate 102 includes an epitaxial layer. For example, the first substrate 102 has an epitaxial layer overlying a bulk semiconductor.

A number of trenches 103 are formed in the first substrate 102. The trenches 103 are configured to form a number of deep trench isolation structures. The depth of each of the trenches 103 is more than half the thickness of the first substrate 102. The trenches 103 are gradually tapered from top to bottom. In other words, each of the trenches 103 has a top width and a bottom width, and the top width is greater than the bottom width. Each of the trenches 103 is extended from the top surface 102*a* of the first substrate 102 and into the first substrate 102. Since the trenches 103 have a depth more than half of the first substrate 102, the trenches are called deep trenches 103. In some embodiments, the trenches 103 are formed by an etching process, such as a dry etching process or a wet etching process.

Afterwards, as shown in FIG. 1B, a first filling material 106 is formed in the trenches 103. The first filling material 106 is formed along the sidewall and bottom surface of the trenches 103. In some embodiments, the first filling material 106 is made of refractive material having a refractive index (n value) smaller than that of silicon (Si).

In some embodiments, the first filling material 106 is a dielectric material, such as oxide or nitride. In some embodiments, the dielectric material is made of silicon oxide, silicon nitride, silicon oxynitride, a low-k dielectric material, or another applicable material. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the first filling material 106 is deposited by a deposition process, such as a plasma enhanced chemical vapor deposition (PECVD) process or by a spin coating process.

Figure 1A:
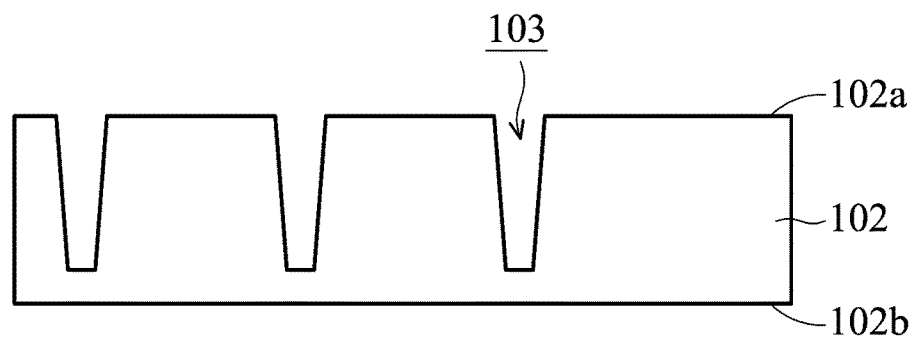
Figure 1B:
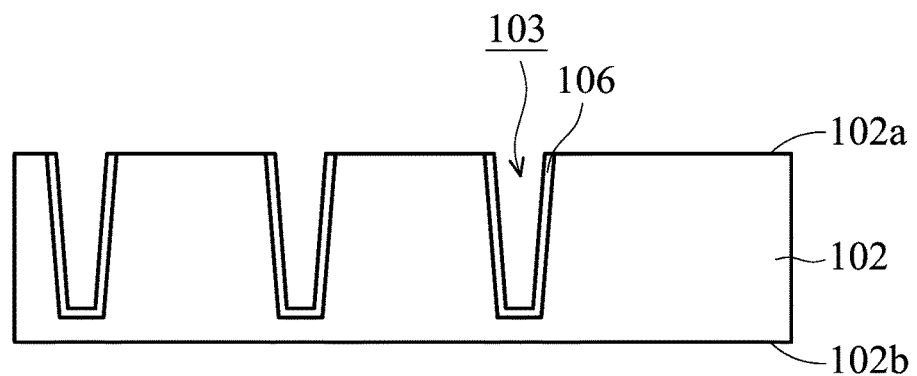
Figure 1C:
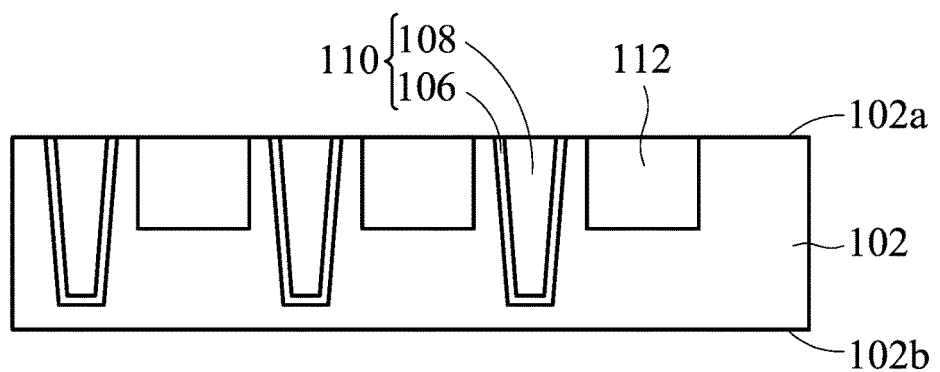

Next, as shown in FIG. 1C, a second filling material 108 is formed on the first filling material 106, in accordance with some embodiments of the disclosure. A deep trench isolation structure 110 is constructed by the second filling material 108 and the first filling material 106. The deep trench isolation structure 110 is configured to reduce the cross-talk between two adjunct pixel regions 112 (formed later).

Since the deep trenches 103 have a high aspect ratio, the second filling material 108 is chosen to have better gap-filling capabilities than the first filling material 106 to avoid a void being formed in the trenches 103. In some embodiments, the second filling material 108 is made of polyisilicon, and the first filling material 106 is made of silicon oxide. In some other embodiments, the second filling material 108 is made of high heat resistance material, such as tungsten (W).

Afterwards, a number of pixel regions 112 are formed in the first substrate 102. The pixel regions 112 may include photosensitive elements. The photosensitive elements may include a photodiode, a partially pinned photodiode, a pinned photodiode, a photogate, or a photocapacitor. The pixel regions 112 include pixel regions 112R, 112G and 112B. The pixel regions 112 may be doped regions having n-type and/or p-type dopants. The pixel regions 112 may be formed by an ion implantation process, diffusion process or another applicable process.

Figure 1D:
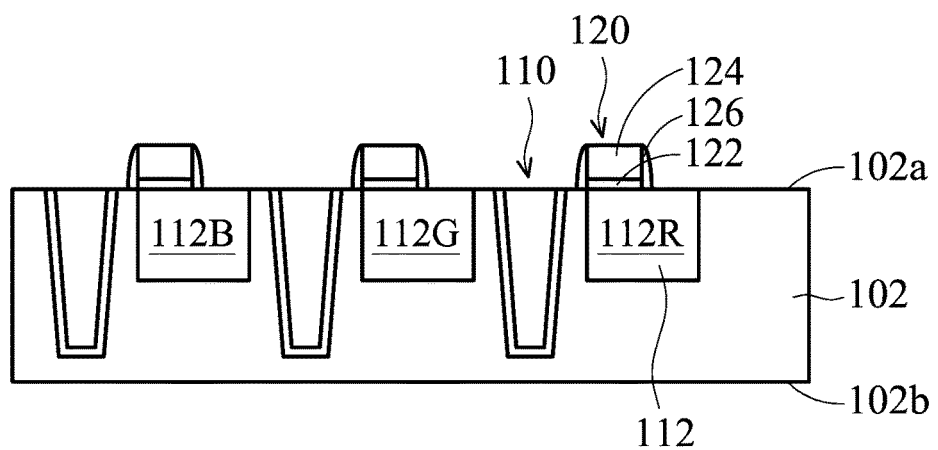
Figure 1E:
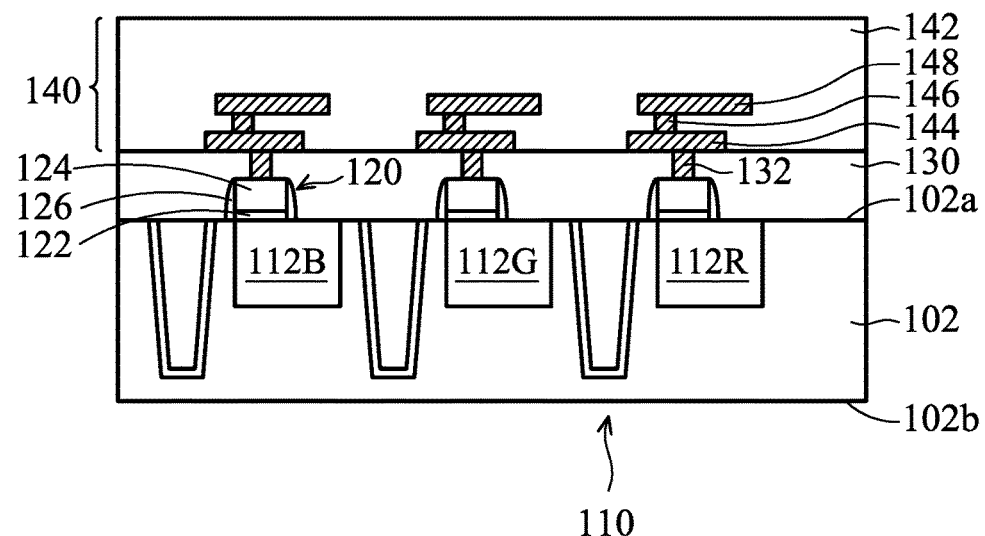
Figure 1F:
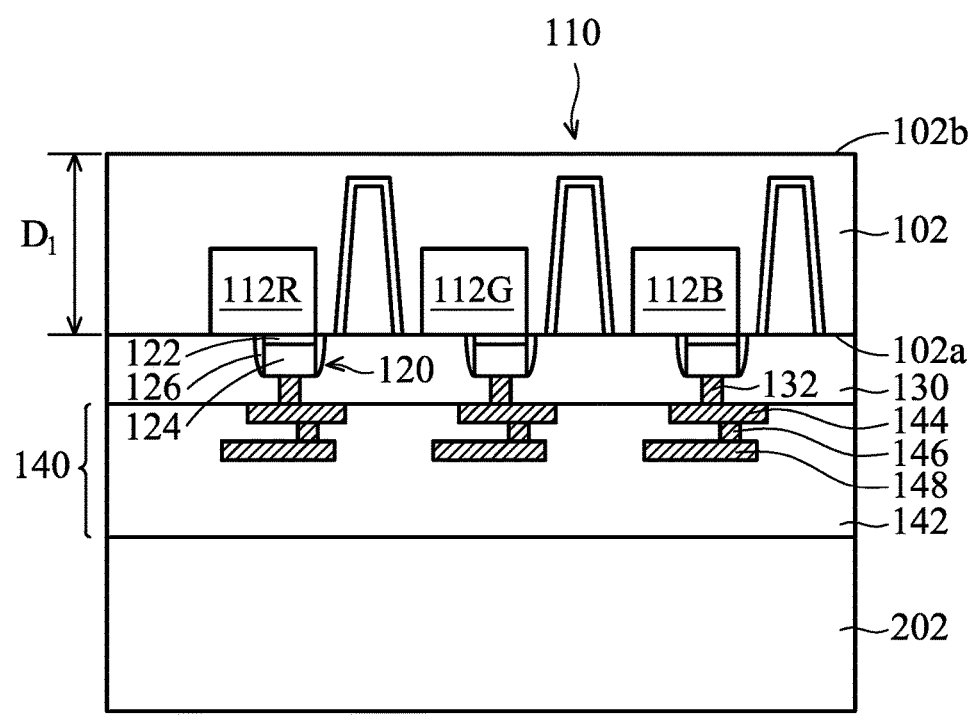
Figure 1G:
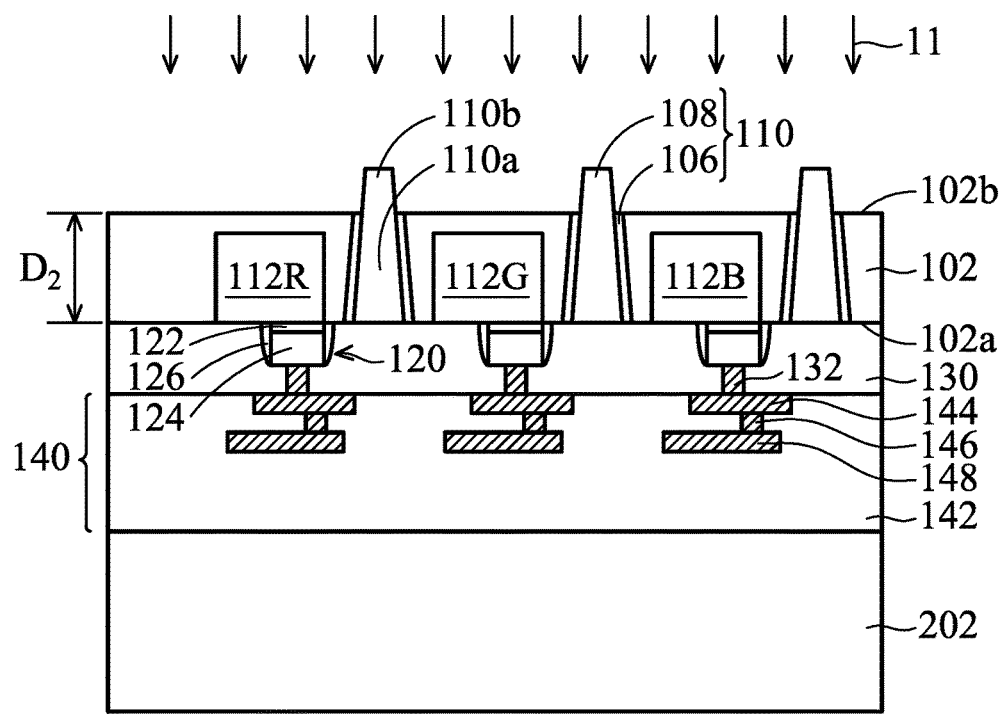
Figure 1H:
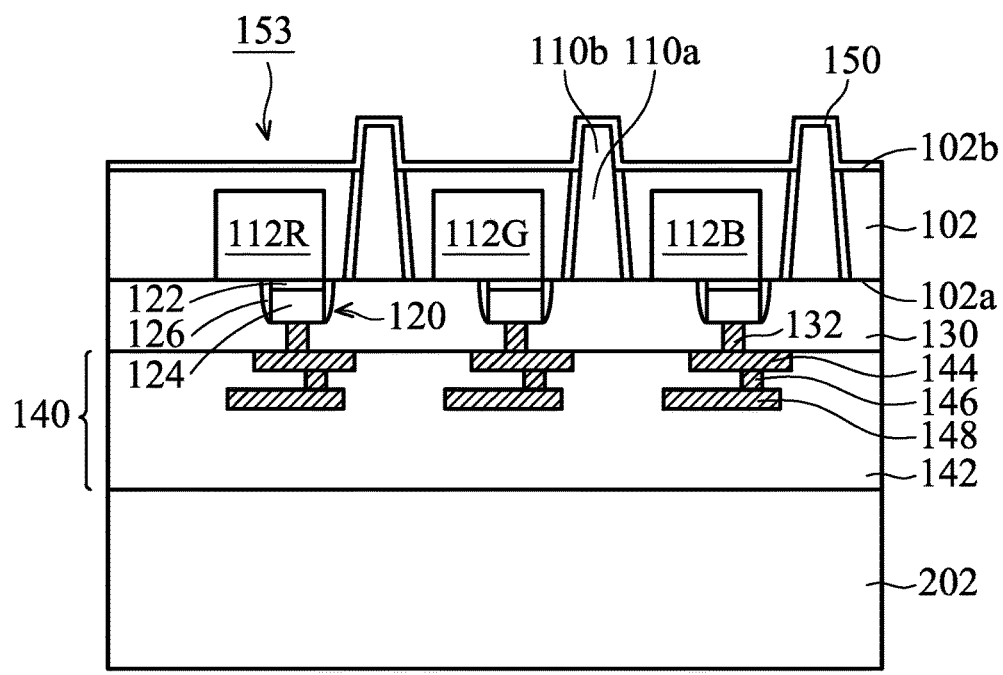
Figure 1I:
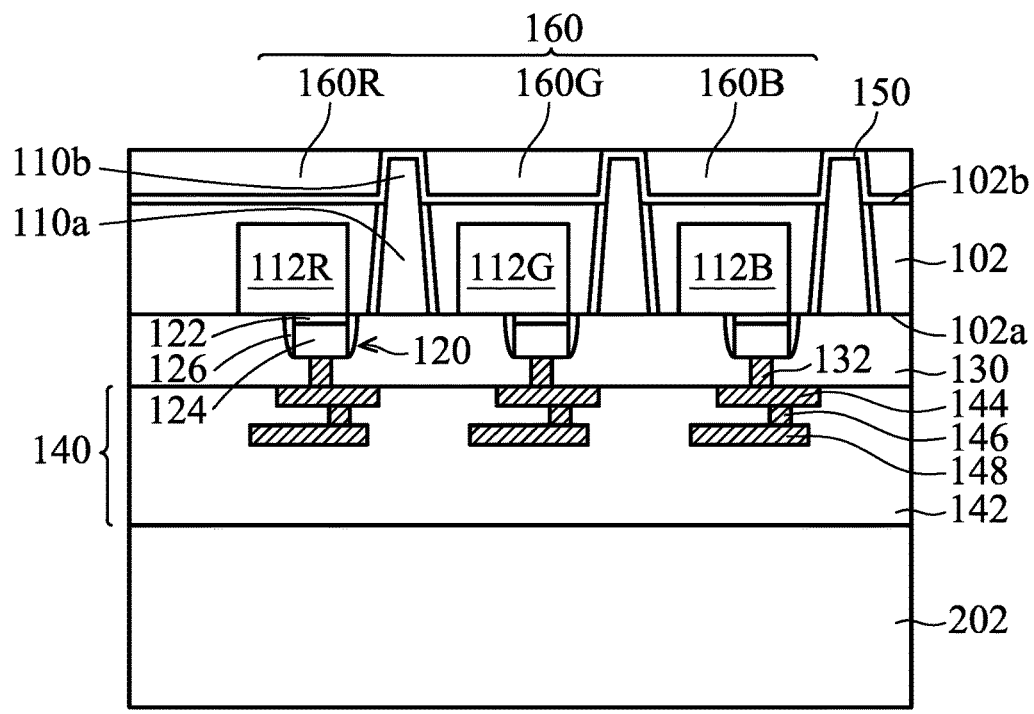

The deep trench isolation structure 110 is not only used as an isolation structure between two adjacent pixel regions 112, but also used as grid structure for separating two adjacent color filter layers 160 (shown in FIG. 1I). It should be noted that the deep trench isolation structure 110 is formed in the front-end of-line (FEOL) of semiconductor fabrication process.

Next, as shown in FIG. 1D, a transistor device 120 is formed on the top surface 102a of the first substrate 102, in accordance with some embodiments of the disclosure. The transistor device 120 includes a gate dielectric layer 122, a gate electrode layer 124 formed on the gate dielectric layer 122. In addition, the gate spacers 126 are formed on the sidewalls of the transistor device 120. In some other embodiments, a portion of the gate spacers 126 is in direct contact with the deep trench isolation structure 110.

The gate dielectric layer 122 is made of silicon oxide, silicon nitride, or a high dielectric constant material (high-k material). In some embodiments, the gate dielectric layer 122 is formed by a chemical vapor deposition (CVD) process. The gate electrode layer 124 is made of polysilicon or conductive material. The conductive material may include metal (e.g., tantalum, titanium, molybdenum, tungsten, platinum, aluminum, hafnium, ruthenium), a metal silicide (e.g., titanium silicide, cobalt silicide, nickel silicide, tantalum silicide), or a metal nitride (e.g., titanium nitride, tantalum nitride). In some embodiments, the gate electrode layer 124 is formed by a chemical vapor deposition (CVD) process or physical vapor deposition (PVD) process.

In some embodiments, the gate spacers 126 are made of silicon oxide, silicon nitride, silicon oxynitride or other applicable material. In some embodiments, the gate spacers 126 are formed by a chemical vapor deposition (CVD) process or physical vapor deposition (PVD) process.

Next, as shown in FIG. 1E, an inter-layer dielectric (ILD) layer 130 is formed on the top surface 102a of the first substrate 102 and over the transistor device 120, in accordance with some embodiments of the disclosure. A contact structure 132 is formed on the transistor device 120.

The ILD layer 130 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. The ILD layer 130 may be formed by chemical vapor deposition (CVD), physical vapor deposition, (PVD), atomic layer deposition (ALD), spin-on coating, or another applicable process.

Afterwards, an interconnect structure 140 is formed on the ILD layer 130. The interconnect structure 140 includes multiple conductive features formed in a dielectric layer 142 (such as inter-metal dielectric, IMD). The dielectric layer 142 includes a single layer or multiple dielectric layers. The dielectric layer 142 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. In some embodiments, the dielectric layer 142 is formed by a chemical vapor deposition (CVD) process, a spin-on process, a sputtering process, or a combination thereof.

In some embodiments, the dielectric layer 142 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), or porous silicon oxide ($SiO_2$).

The conductive features include a first conductive line 144, a conductive via 146 and a second conductive line 148. The first conductive line 144 is electrically connected to the conductive via 146, and the conductive via 146 is electrically connected to the second conductive line 148. The first conductive line 144 is electrically connected to the transistor device 120 through the contact structure 132.

In some embodiments, the conductive features are made of metal materials, such as copper (Cu), aluminum (Al), titanium (Ti), tantalum (Ta), nickel (Ni), silver (Ag), gold (Au), indium (In), tin (Sn) or a combination thereof. In some embodiments, the conductive features are formed by electroplating, electroless plating, sputtering, chemical vapor deposition (CVD) or another applicable process.

The first conductive line 144, the conductive via 146 and the second conductive line 148 illustrated are exemplary, and the actual position and configuration of the first conductive line 144, the conductive via 146 and the second conductive line 148 may vary according to actual application.

Next, as shown in FIG. 1F, the first substrate 102 is flipped over and bonded to a second substrate 202, in accordance with some embodiments of the disclosure. As a result, the second substrate 202 is below the first substrate 102, and the bottom surface 102b of the first substrate 102 faces up.

The second substrate 202 is formed on the top surface 102a of the first substrate 102. The second substrate 202 is configured to provide protection for the various structures, such as the pixel regions 112. In addition, the second substrate 202 provides mechanical strength and support for processing the bottom surface 102b of the first substrate 102 by the following operation (e.g. the etching process 11, shown in FIG. 1G).

The material of the second substrate 202 may be the same as the material of the first substrate 102. In some embodiments, the first substrate 102 is a silicon wafer, and the second substrate 202 is also a silicon wafer. The second substrate 202 may be made of silicon (Si), silicon-based materials, or other semiconductor materials, such as germanium (Ge). In some embodiments, the second substrate 202 is made of a compound semiconductor such as silicon carbide, gallium arsenic, indium arsenide, or indium phosphide.

The first substrate 102 is bonded to second substrate 202 by bonding the interconnect structure 140 to the second substrate 202. More specifically, the dielectric layer 142 of the interconnect structure 140 is bonded to the second substrate 202. In some embodiments, the second substrate 202 is bonded to the first substrate 102 by performing a fusion bonding process. The fusion bonding process is performed under pressure and heat.

In some other embodiments, a buffer layer (not shown) is formed below the interconnect structure 140, and is configured to facilitate the bonding of the first substrate 102 and the second substrate 202. In some embodiments, the buffer layer is made of a dielectric layer, such as silicon oxide or silicon nitride.

Before the first substrate 102 and the second substrate 202 are bonded together, the surface of the dielectric layer 142 and the surface of the second substrate 202 are treated by a dry treatment or a wet treatment. The dry treatment includes a plasma treatment. The plasma treatment is performed in an inert environment, such as an environment filled with inert gas including $N_2$, Ar, He or combinations thereof. Alternatively, other types of treatments may be used.

During bonding of the first substrate 102 and the second substrate 202, the first substrate 102 may be deformed due to unequal stress. For example, when the first substrate 102 is a wafer and the second substrate 202 is a wafer, the deformation of the central region is different from the deformation of the peripheral region of the wafer due to the unequal stress. Once the first substrate 102 is deformed, any alignment process in a subsequent process may be a challenge. If it is intended that a grid structure be formed in some locations, an alignment operation is needed. However, when the first substrate 102 is deformed due to the bonding process, the alignment operation may be difficult.

Next, as shown in FIG. 1G, a portion of the first substrate 102 is removed to expose the bottom of the deep trench isolation structure 110, in accordance with some embodiments of the disclosure. As a result, the deep trench isolation structure 110 extends vertically through the first substrate 102, and protrudes above the bottom surface 102b of the first substrate 102.

In some embodiments, the portion of the first substrate 102 is removed by an etching process 11, such as a selective etching process. In addition, a portion of the first filling material 106 is removed by the etching process 11.

It should be noted that the profile of the deep trench isolation structure 110 is preserved by using a selective etching process 11. The etching process 11 has a higher selectivity for oxide and silicon, and therefore the portion of the first substrate 102 made of silicon is removed, but the deep trench isolation structure 110 made of oxide is remaining. After the etching process 11, the thickness of the first substrate 102 is decreased from a first thickness $D_1$ to a second thickness $D_2$.

It should be noted that, after the etching process 11, a portion of the deep trench isolation structure 110 protrudes above the bottom surface 102b of the first substrate 102. Furthermore, the first filling material 106 is exposed. As a result, the deep trench isolation structure 110 includes a buried portion 110a and a protruding portion 110b. The deep trench isolation structure 110 has a top surface above the bottom surface 102b of the first substrate 102 and a bottom surface leveled with the top surface 102a of the first substrate 102. The top width of the top surface is narrower than the bottom width of the bottom surface of the deep trench isolation structure 110. In other words, the deep trench isolation structure 110 is tapered from the buried portion 110a to the protruding portion 110b of the deep trench isolation structure 110.

If a deep trench isolation structure and a grid structure are formed in separate steps, the alignment may be difficult, especially when the first substrate 102 is deformed by the bonding process. Furthermore, if a gap is between the deep trench isolation structure and a grid structure, some light may escape to the neighboring pixel region 112 through the gap. In order to solve the problem mentioned above, the deep trench isolation structure 110 is formed in a single step. More specifically, the deep trench isolation structure 110 is formed in a front-end-of-line (FEOL) process before the first substrate 102 is bonded to the second substrate 202. In order to avoid light-loss problems, the deep trench isolation structure 110 extends continuously through the first substrate 102 in a vertical direction and is a continuous structure having dual functions. The deep trench isolation structure 110 includes a buried portion 110a and a protruding portion 110b. The buried portion 110a of the deep trench isolation structure 110 is used as an isolation structure between two adjacent pixel regions 112 a. The protruding portion 110b of the deep trench isolation structure 110 is used as a grid structure between two adjacent color filter layers 160 (formed later, shown in FIG. 1I) to minimize the light loss and optical cross-talk.

It should be noted that two adjacent protruding portions 110b of the deep trench isolation structures 110 define a recess 153. The recess 153 has a U-shaped structure. In some embodiments, a number of recesses 153 are formed next to the protruding portions 110b. The bottom of the recess 153 is the first substrate 102, and the sidewall of the recess 153 is the protruding portions 110b of the deep trench isolation structures 110. The recess 153 is formed before the color filter layer 160 (formed later, shown in FIG. 1I) is formed, and it provides a space to accommodate the color filter layer 160. Therefore, the color filter layer 160 is self-aligned into the corresponding recess 153.

Next, as shown in FIG. 1H, a passivation layer 150 is formed on the deep trench isolation structure 110 and on the first substrate 102, in accordance with some embodiments of the disclosure. The passivation layer 150 is conformally formed on deep trench isolation structure 110. The term "conformally" means the profile of the passivation layer 150 follows the profile of the deep trench isolation structure 110. The passivation layer 150 is configured to protect the underlying layers from being damaged or polluted by the outer environment, such as air or water vapor.

The passivation layer 150 is made of silicon oxide, silicon nitride, low-k dielectric material or another applicable dielectric material. In some embodiments, the passivation layer 150 is made of anti-reflective material, such as anti-reflective coating (ARC) layer. In some other embodiments, the passivation layer 150 is made of high transmission material. The passivation layer 150 is formed by a deposition process, such as a chemical vapor deposition process (CVD), a physical vapor deposition process (PVD), a spin-on coating process, a sputtering process, a planting process, or a combination thereof.

The passivation layer 150 is formed on the deep trench isolation structure 110, but the recess 153 is not completely filled with the passivation layer 150. The U-shaped structure of the recess 153 remains on the protruding portions 110b of the deep trench isolation structures 110. Therefore, the portion of the passivation layer 150 directly on the protruding portion 110a is higher than the other portion of the passivation layer 150 directly on the first substrate 102.

Afterwards, as shown in FIG. 1I, a number of color filter layers 160 are formed on the recesses 153, in accordance with some embodiments of the disclosure. The color filter layers 160 include color filter layers 160R, 160G and 160B. The passivation layer 150 is formed between the first substrate 102 and the color filter layers 160.

The color filter layer 160R aligned with the pixel region 112R is configured to filter visible light and allow light in the red wavelength to pass through to the pixel region 112R. The color filter layer 160G aligned with the pixel region 112G is configured to filter visible light and allow light in the green wavelength to pass through to the pixel region 112G. The color filter layer 160B aligned with the pixel region 112B is configured to filter visible light and allow light in the blue wavelength to pass through to the pixel region 112B.

The color filter layers 160R, 160G and 160B are made of dye-based (or pigment-based) polymer for filtering out a specific frequency band (for example, a desired wavelength of light). In some other embodiments, the color filter layers 160 are made of resins or other organic-based materials having color pigments.

Figure 1J:
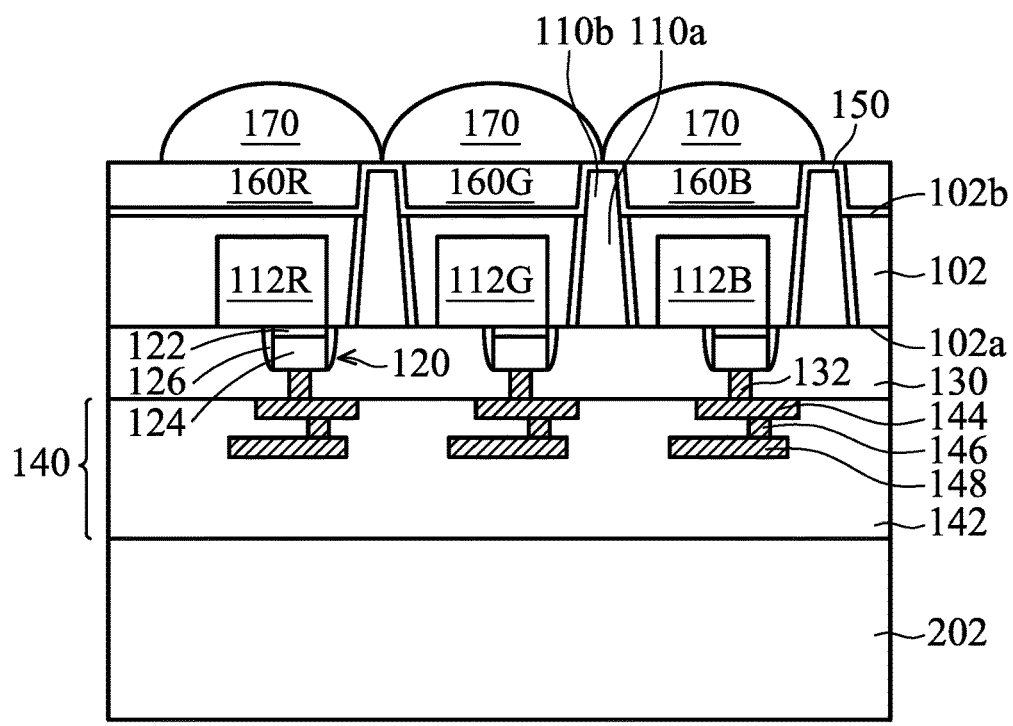

Next, as shown in FIG. 1J, a number of microlens structures 170 are formed over the color filter layers 116, in accordance with some embodiments of the disclosure. In some embodiments, the microlens structures 170 have curved upper surface. The microlens structures 170 may have a variety of shapes and sizes depending on the index of refraction of the material used for the microlens structures 170.

Figure 1K:
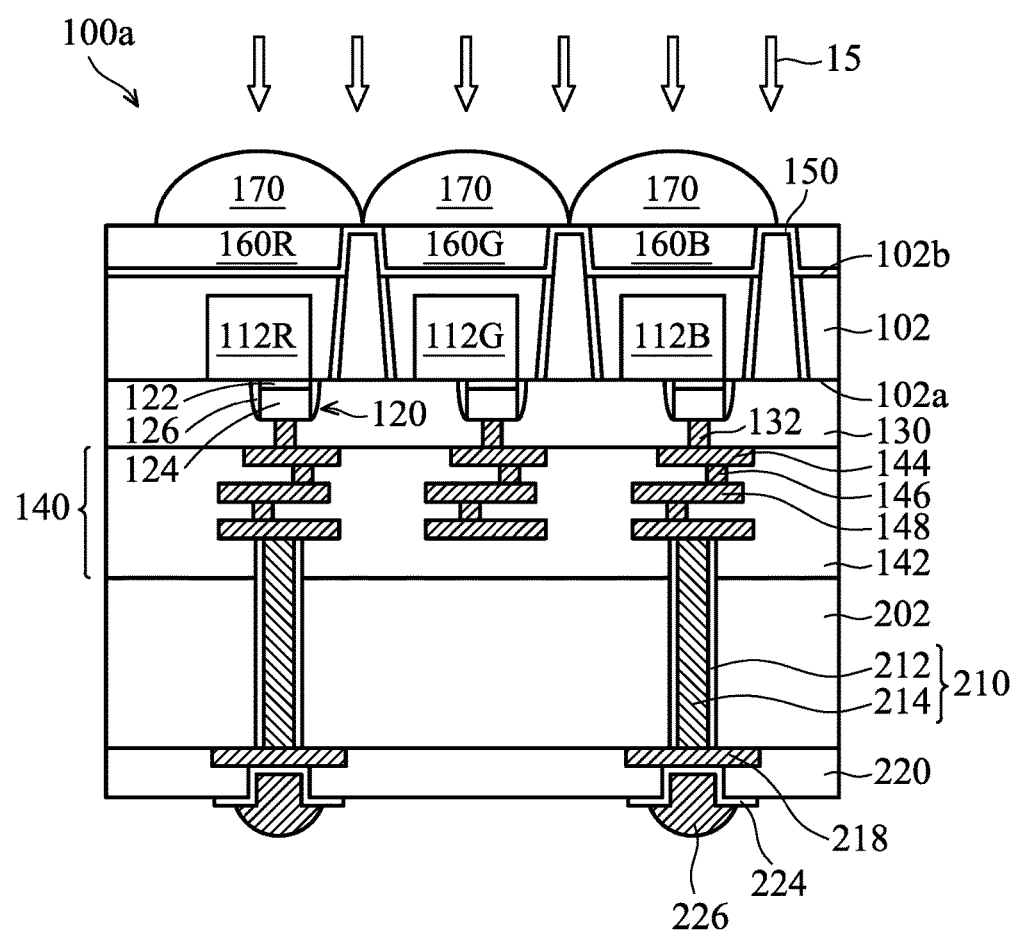

Afterwards, as shown in FIG. 1K, a through-silicon via (TSV) structure 210 is formed through the second substrate 202, in accordance with some embodiments of the disclosure. The TSV structure 210 provides electrical connections. The TSV structure 210 extends into the dielectric layer 142 and is electrically connected to the conductive line of the interconnect structure 140.

The TSV structure 210 includes a liner 212 and a conductive material 214 formed on the liner 212. The liner 212 is made of an insulating material, such as oxide, nitride or another applicable material. The liner 212 is formed by a deposition process, such as chemical vapor deposition process (CVD), physical vapor deposition process (PVD), spin-on coating process. The conductive material 214 is made of copper (Cu), copper alloy, aluminum (Al), aluminum alloys, or combinations thereof. The conductive material 214 is formed by electroplating, a sputtering process, a planting process, or a combination thereof.

A metal pad layer 218 is formed over the TSV structure 210, and a dielectric layer 220 is formed over the metal pad layer 218. The metal pad layer 218 is electrically connected to the TSV structure 210. The metal pad layer 218 is made of conductive materials with low resistivity, such as copper (Cu), aluminum (Al), Cu alloys, Al alloys, or other applicable materials.

An under bump metallization (UBM) layer 224 is formed on the metal pad layer 218, and a conductive element 226 (such as solder ball) is formed over the UBM layer 224. The conductive element 226 is electrically connected to the metal pad layer 218, and therefore the conductive element 226 is electrically connected to the interconnect structure 140 through the TSV structure 210 and the metal pad layer 218.

The UBM layer 224 may contain an adhesion layer and/or a wetting layer. In some embodiments, the UBM layer 224 is made of titanium (Ti), titanium nitride (TiN), tantalum nitride (TaN), tantalum (Ta), or the like. In some embodiments, the UBM layer 224 further includes a copper seed layer. In some embodiments, the conductive element 226 is made of conductive materials with low resistivity, such as solder or solder alloy. Exemplary elements included in the solder alloy include Sn, Pb, Ag, Cu, Ni, Bi or combinations thereof. Therefore, the backside illuminated image sensor device structure 100a is obtained.

In operation, the BSI image sensor device structure 100a is designed to receive an incident light 15 traveling towards the bottom surface 102b of the first substrate 102. Firstly, the microlens structures 170 directs the incident light 15 to the color filter layers 160R, 160G and 160B. Next, the incident light 15 passes from the color filter layers 160R, 160G and 160B to the pixel regions 112R, 112G and 112B. In some embodiments, the incident light 15 is a visual light beam, infrared (IR) light, ultraviolet (UV) light, or another proper radiation light.

As mentioned above, during bonding of the first substrate 102 and the second substrate 202, the first substrate 102 may be deformed due to unequal stress. The deformation degrades the accuracy for alignment of the patterns. Therefore, the deep trench isolation structure 110 of the disclosure is formed in a single step using a front-end-of-line (FEOL) process to solve the problems mentioned above.

The deep trench isolation structure 110 has two functions and can be used as an isolation structure and as a grid structure. The deep trench isolation structure 110 has a continuous structure and has no gap therein to prevent light from passing through the gap between the isolation structure and the grid structure. In addition, since the deep trench isolation structure 110 is formed in a single step, the position of the deep trench isolation structure 110 may be controlled easily without any consideration of the alignment between the isolation structure and the grid structure. Therefore, the fabrication time and cost for forming the deep trench isolation structure 110 are reduced.

Figure 2:
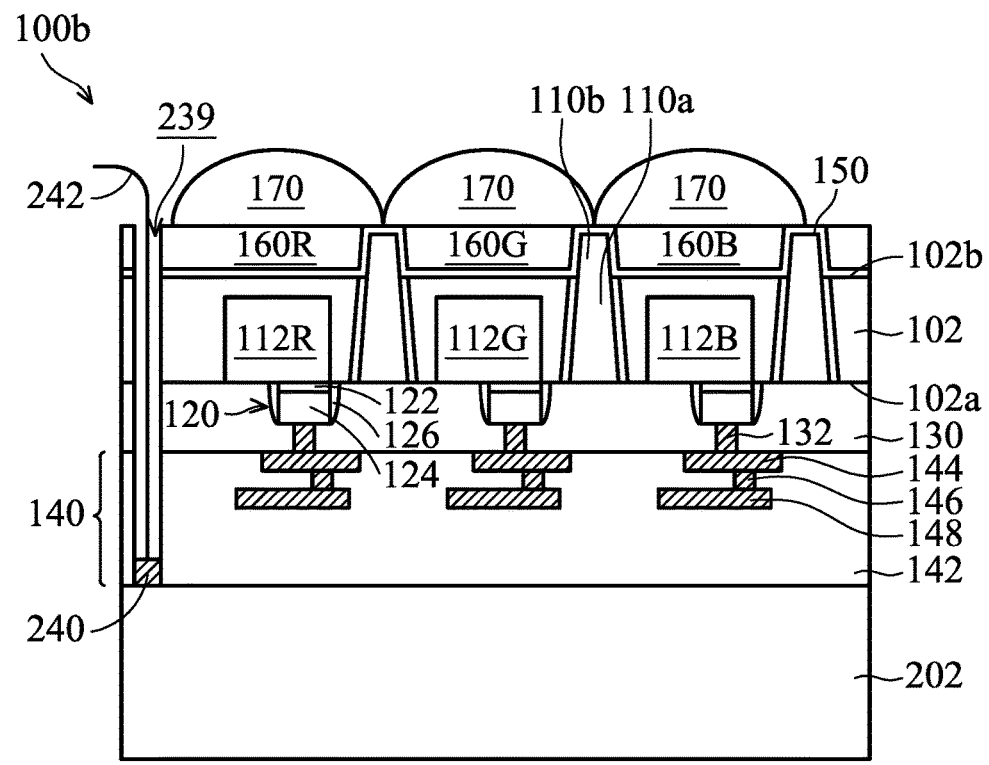

FIG. 2 shows a cross-sectional representation of a backside illuminated image sensor device structure 100b, in accordance with some embodiments of the disclosure. The backside illuminated image sensor device structure 100b is similar to the backside illuminated image sensor device structure 100a, except that an electrical connection structure (wire bonding structure) is formed in a peripheral region. A metal pad layer 240 is formed in a trench 239 and the trench 239 is through the interconnect structure 140 and the first substrate 102. A connector 242 is electrically connected to the metal pad layer 240.

FIGS. 3A-3H show cross-sectional representations of various stages of forming a backside illuminated image sensor device structure 100c, in accordance with some embodiments of the disclosure. Some processes and materials used to form the backside illuminated image sensor device structure in FIGS. 3A-3H are similar to those used to form the backside illuminated image sensor device structure in FIGS. 1A-1J and are not repeated herein.

Figure 3A:
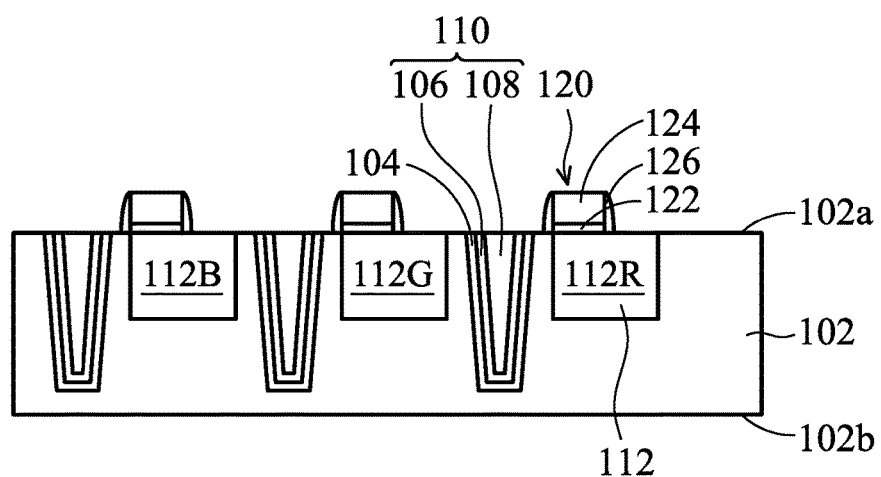

As shown in FIG. 3A, the deep trench isolation structure 110 is formed in the first substrate 102, and a doped liner 104 surrounds the deep trench isolation structure 110. A number of pixel regions 112 are formed in the first substrate 102 and the deep trench isolation structure 110 is formed between two adjacent pixel regions 112. Each of the pixel regions 112 is doped with a first conductivity type, and the doped liner 104 is doped with a second conductivity type. In some embodiments, each of the pixel regions 112 is doped with n-type conductivity, and the doped liner 104 is doped with a p-type conductivity, such as boron (B).

Some defects (such as dangling bonds) may be formed on the surfaces of the deep trenches 103 during formation of the deep trenches 103. These defects may be physical defects or electrical defects and could trap carriers, such as electrons. The trapped carriers may produce "leakage current". For example, with a sufficient amount of leakage current, the pixel regions 112 may falsely detect "light", even when the BSI image sensor device 100c is placed in an optically dark environment. In this situation, the leakage current may be referred to as a "dark current", and the dark current degrades the performance of the BSI image sensor device 100c. The doped liner 104 is configured to reduce the dark current and therefore to reduce electrical cross-talk.

The transistor device 120 is formed on the top surface 102a of the first substrate 102, in accordance with some embodiments of the disclosure. The transistor device 120 includes the gate dielectric layer 122, the gate electrode layer 124 formed on the gate dielectric layer 122. In addition, the gate spacers 126 are formed on the sidewalls of the transistor device 120.

Figure 3B:
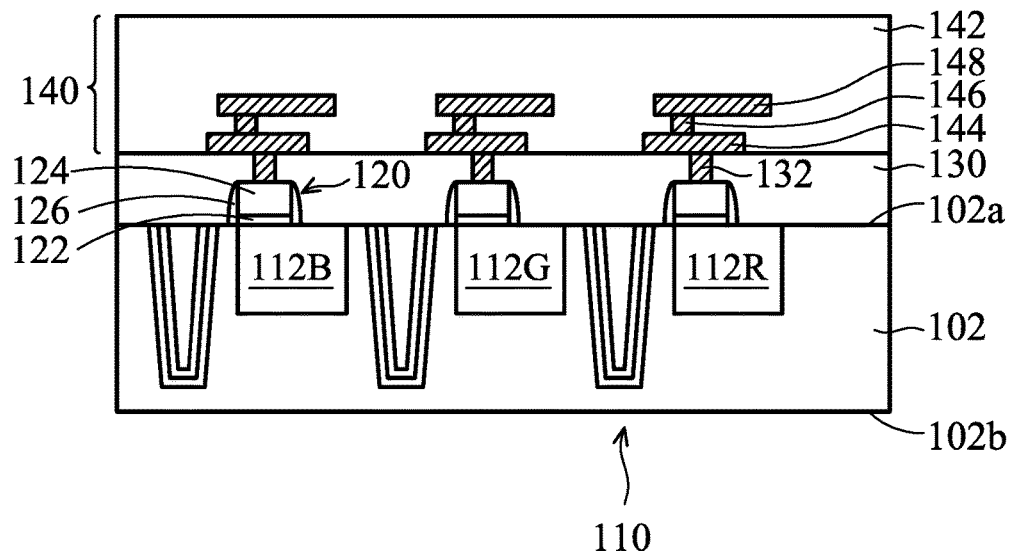

Afterwards, as shown in FIG. 3B, the ILD layer 130 is formed over the top surface 102a of the first substrate 102, and the interconnect structure 140 is formed over the ILD layer 130, in accordance with some embodiments of the disclosure. The interconnect structure 140 includes multiple conductive features formed in a dielectric layer 142 (such as inter-metal dielectric, IMD).

Figure 3C:
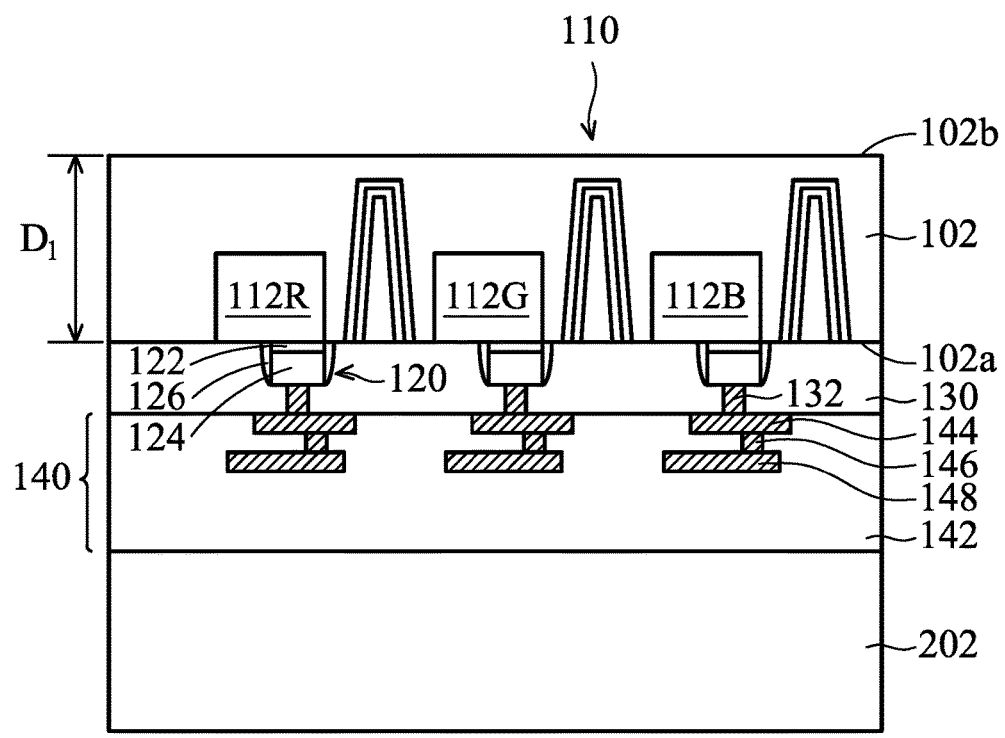

Next, as shown in FIG. 3C, the first substrate 102 is flipped over and bonded to a second substrate 202, in accordance with some embodiments of the disclosure. As a result, the second substrate 202 is below the first substrate 102, and the bottom surface 102b of the first substrate 102 faces up.

Figure 3D:
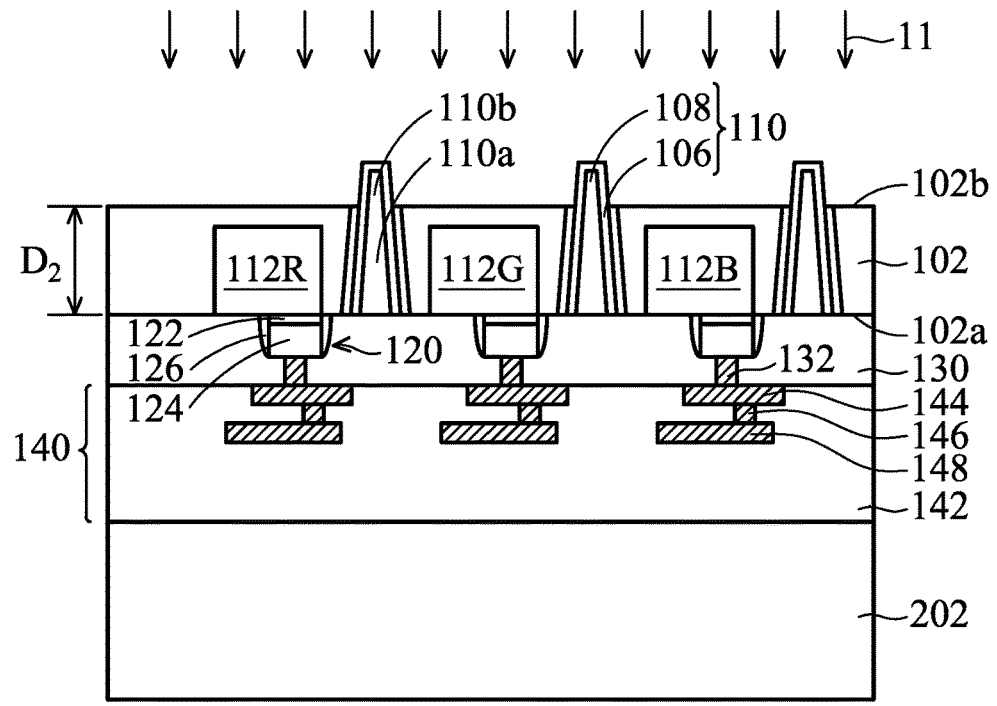

Next, as shown in FIG. 3D, a portion of the first substrate 102 is removed to expose the bottom of the deep trench isolation structure 110, in accordance with some embodiments of the disclosure. The bottom surface of the first substrate 102 is etched by the etching process 11. In addition, a portion of the doped liner 104 is removed by the etching process 11. As a result, the deep trench isolation structure 110 includes a buried portion 110a and a protruding portion 110b. The recess 153 is constructed of two adjacent protruding portions 110b.

Figure 3E:
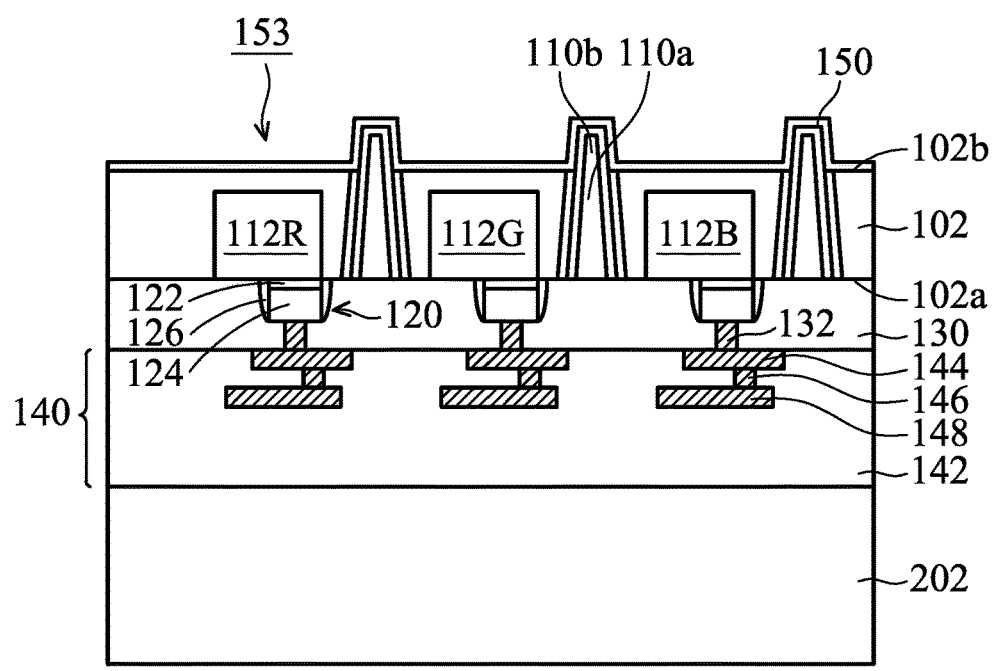

Afterwards, as shown in FIG. 3E, the passivation layer 150 is formed on the deep trench isolation structure 110 and on the first substrate 102, in accordance with some embodiments of the disclosure. The passivation layer 150 is conformally formed on the deep trench isolation structure 110, and therefore the recess 153 is not completely filled with the passivation layer 150. There still some spaces in the recess 153 for forming the color filter layer 160R, 160G and 160B.

Figure 3F:
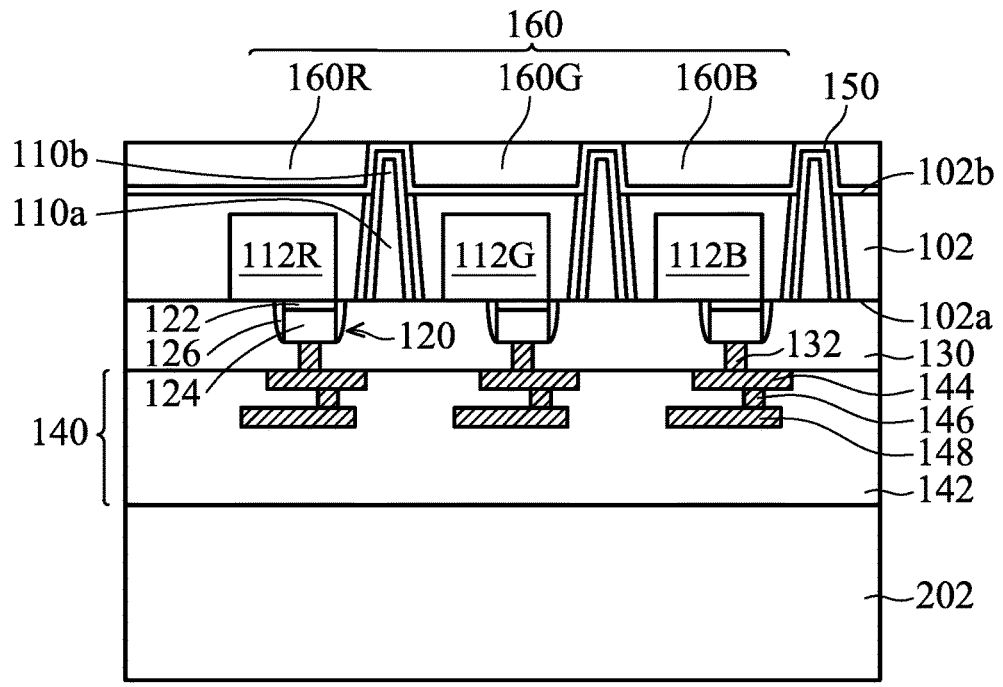

Next, as shown in FIG. 3F, a number of color filter layers 160 are formed on the recess 153, in accordance with some embodiments of the disclosure. Since the recesses 153 are pre-formed, the color filter layer 160R, 160G and 160B are self-aligned in the recess 153. The accuracy of the alignment is improved by the pre-formed recess 153.

Figure 3G:
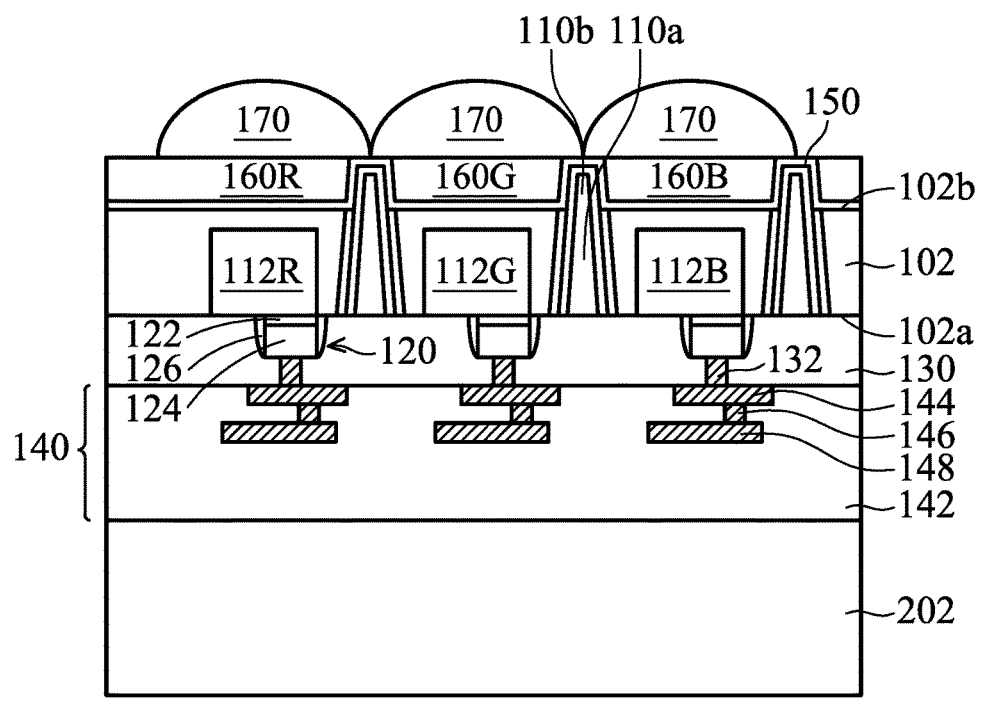

Afterwards, as shown in FIG. 3G, a number of microlens structures 170 are formed over the color filter layers 116, in accordance with some embodiments of the disclosure. In some embodiments, the microlens structures 170 have curved upper surfaces.

Figure 3H:
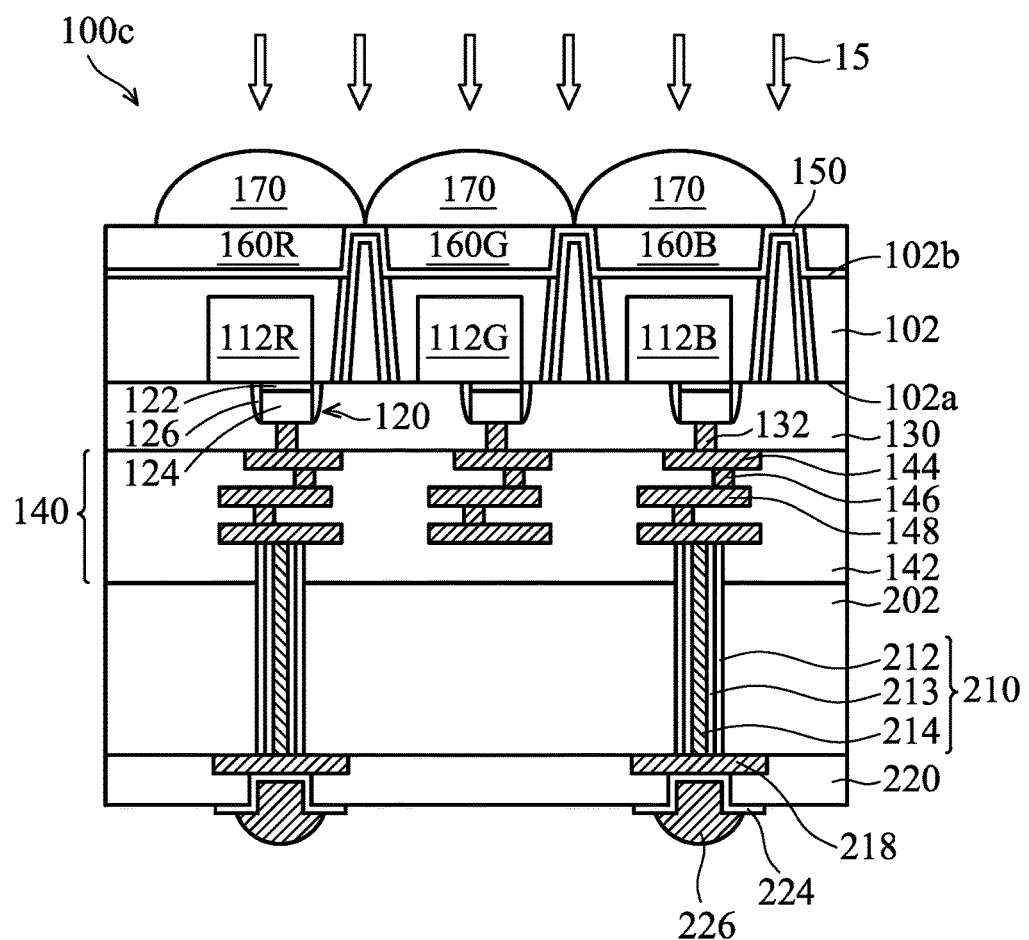

Next, as shown in FIG. 3H, the through-silicon via (TSV) structure 210 is formed through the second substrate 202, in accordance with some embodiments of the disclosure. The TSV structure 210 provides an electrical path from the transistor device 120, through the interconnect structure 140 to the conductive element 226. The TSV structure 210 extends into the dielectric layer 142 and is electrically connected to the conductive line of the interconnect structure 140.

The TSV structure 210 includes the liner 212, a diffusion barrier layer 214, and the conductive material 216. The diffusion barrier layer 214 is made of Ta, TaN, Ti, TiN, or CoW. In some embodiments, the diffusion barrier layer 214 is formed by a chemical vapor deposition (CVD) process, or a physical vapor deposition (PVD) process. The conductive element 226 is electrically connected to the metal pad layer 218, and therefore the conductive element 226 is electrically connected to the interconnect structure 140 through the TSV structure 210 and the metal pad layer 218.

Embodiments for forming a BSI image sensor device structure and method for formation of the same are provided. The deep trench isolation structure is formed in a first substrate, and an interconnect structure is formed over the top surface of the first substrate. The first substrate is bonded to a second substrate by bonding the interconnect structure to the second substrate. A portion of the first substrate is removed to expose a portion of the deep trench isolation structure to form a protruding portion. Two adjacent protruding portions of the deep trench isolation structure define a number of recesses, and a number of color filter layers are self-aligned in the recesses. The protruding portion of the deep trench isolation structure is used as a grid structure between two adjacent color filter layers. The deep trench isolation structure plays two roles and is formed in a single step without any consideration of the alignment issue. Therefore, the fabrication time and cost are reduced. Accordingly, the performance of the BSI image sensor device structure is improved further.

In some embodiments, a BSI image sensor device structure is provided. The BSI image sensor includes a first substrate having a top surface and a bottom surface, and a plurality of pixel regions formed at the top surface of the first substrate. The BSI image sensor also includes a grid structure through the first substrate and between two adjacent pixel regions. The grid structure extends continuously through the first substrate in a vertical direction and has a top surface and a bottom surface, the top surface of the grid structure protrudes above the bottom surface of the first substrate, and the bottom surface is leveled with the top surface of the first substrate.

In some embodiments, a BSI image sensor device structure is provided. The BSI image sensor includes a first wafer having a top surface and a bottom surface and a transistor device formed on the top surface of the first wafer. The BSI image sensor also includes an isolation structure formed through the first wafer and above the bottom surface of the first wafer, and the isolation structure has a buried portion and a protruding portion, and the protruding portion is above the bottom surface of the first wafer. The BSI image sensor further includes a passivation layer formed on the protruding portion of the isolation structure and a recess formed adjacent to the protruding portion of the isolation structure. The BSI image sensor also includes a color filter layer filling the recess.

In some embodiments, a method for forming a BSI image sensor device structure is provided. The method includes forming a grid structure in a first substrate and forming a transistor device over the grid structure. The method includes removing a portion of the first substrate from a bottom surface of the first substrate to form an etched surface on the first substrate, such that the grid structure protrudes above the etched surface of the first substrate and defines a recess adjacent to the grid structure. The method includes forming a color filter layer in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A backside illuminated image sensor device structure, comprising:
    a first substrate having a top surface and a bottom surface;
    a plurality of pixel regions formed at the top surface of the first substrate;
    a grid structure through the first substrate and between two adjacent pixel regions of the plurality of pixel regions, wherein the grid structure extends continuously through the first substrate in a vertical direction and has a front surface and a bottom surface, the front surface of the grid structure protrudes above the bottom surface of the first substrate, and the bottom surface of the grid structure is leveled with the top surface of the first substrate, and wherein a portion of the grid structure protrudes above the bottom surface of the first substrate to form a protruding portion, and adjacent protruding portions of the grid structure defines a recess between the adjacent protruding portions of the grid structure;
    a doped liner surrounding a portion of the grid structure;
    a passivation layer formed on another portion of the grid structure, wherein the passivation layer is directly over the doped liner; and
    a color filter layer formed in the recess, wherein a top surface of the color filter layer is substantially level with a top surface of the passivation layer.

2. The backside illuminated image sensor device structure as claimed in claim 1, wherein each respective pixel region of the plurality of pixel regions is doped with a first conductivity type, and the doped liner is doped with a second conductivity type that is different from the first conductivity type.

3. The backside illuminated image sensor device structure as claimed in claim 1, wherein the passivation layer is between the color filter layer and the grid structure.

4. The backside illuminated image sensor device structure as claimed in claim 1, wherein the grid structure is tapered from the bottom surface of the grid structure which is level with the top surface of the first substrate to the top surface of the grid structure.

5. The backside illuminated image sensor device structure as claimed in claim 1, further comprising:
    a transistor device formed over the top surface of the first substrate; and
    an interconnect structure formed over the transistor device.

6. The backside illuminated image sensor device structure as claimed in claim 1, further comprising:
    a second substrate formed on the top surface of the first substrate; and
    a through-silicon via (TSV) structure through the second substrate.

7. The backside illuminated image sensor device structure as claimed in claim 1, wherein the first substrate has a deep trench through the first substrate, and the grid structure is formed in the deep trench.

8. A backside illuminated image sensor device structure, comprising:
    a first wafer having a top surface and a bottom surface;
    a transistor device formed on the top surface of the first wafer;
    an isolation structure formed through the first wafer and above the bottom surface of the first wafer, wherein the isolation structure has a buried portion and a protruding portion, and the protruding portion of the isolation structure is above the bottom surface of the first wafer;
    a passivation layer formed on the protruding portion of the isolation structure;
    a recess formed adjacent to the protruding portion of the isolation structure; and
    a color filter layer filling the recess, wherein a top surface of the color filter layer is substantially level with a top surface of the passivation layer.

9. The backside illuminated image sensor device structure as claimed in claim 8, further comprising:
    a pixel region formed in the first wafer; and
    a doped liner surrounding the buried portion of the isolation structure, wherein the pixel region is doped with a first conductivity type, and the doped liner is doped with a second conductivity type that is different from the first conductivity type, and wherein the passivation layer is directly over the doped liner.

10. The backside illuminated image sensor device structure as claimed in claim 8, wherein the isolation structure is tapered from the buried portion of the isolation structure to the protruding portion of the isolation structure.

11. The backside illuminated image sensor device structure as claimed in claim 8, further comprising:
    an interconnect structure formed over the transistor device, wherein the interconnect structure comprises a conductive feature in a dielectric layer.

12. The backside illuminated image sensor device structure as claimed in claim 11, further comprising:
    a second wafer formed over the top surface of the first wafer, wherein the second wafer is bonded to the first wafer by bonding the dielectric layer of the interconnect structure and the second wafer.

13. The backside illuminated image sensor device structure as claimed in claim 12, further comprising:

a through-silicon via (TSV) structure in the second wafer, wherein the TSV structure is electrically connected to the conductive feature of the interconnect structure.

14. A method for forming a backside illuminated image sensor device structure, comprising:
    forming a trench in the first substrate;
    forming a doped liner surrounding the trench;
    forming a first fill material and a second fill material in the trench to form a grid structure in a first substrate;
    forming a transistor device over the grid structure;
    forming an interconnect structure over the transistor device;
    forming a second substrate over the interconnect structure, wherein the interconnect structure is between the first substrate and the second substrate;
    removing a portion of the first substrate from a bottom surface of the first substrate to form an etched surface on the first substrate, such that the grid structure protrudes above the etched surface of the first substrate and defines a recess adjacent to the grid structure;
    forming a passivation layer on the etched surface of the first substrate and the grid structure, wherein the passivation layer is formed between the grid structure and a color filter layer, and the passivation layer is directly over the doped liner; and
    forming the color filter layer in the recess, wherein a top surface of the color filter layer is substantially level with a top surface of the passivation layer.

15. The method for forming the backside illuminated image sensor device structure as claimed in claim 14, further comprising:
    forming a contact structure over the transistor device, wherein the contact structure is electrically connected to the interconnect structure.

16. The method for forming the backside illuminated image sensor device structure as claimed in claim 14, further comprising:
    forming a through-silicon via (TSV) structure in the second substrate, wherein the transistor device is electrically connected to the TSV structure.

17. The backside illuminated image sensor device structure as claimed in claim 1, wherein the passivation layer is between the color filter layer and the bottom surface of the first substrate.

18. The method for forming the backside illuminated image sensor device structure as claimed in claim 14, further comprising:
    removing a portion of the first substrate and a portion of the doped liner from the bottom surface of the first substrate.

19. The method for forming the backside illuminated image sensor device structure as claimed in claim 14, wherein the passivation layer is between the color filter layer and the bottom surface of the first substrate.

20. The method for forming the backside illuminated image sensor device structure as claimed in claim 14, wherein the grid structure is tapered from a bottom surface of the grid structure which is level with a top surface of the first substrate to a top surface of the grid structure.

* * * * *